(12) United States Patent
Wang et al.

(10) Patent No.: US 8,912,817 B2
(45) Date of Patent: Dec. 16, 2014

(54) RECONFIGURABLE MULTI-PORT PHYSICAL UNCLONABLE FUNCTIONS CIRCUIT

(71) Applicant: Ningbo University, Ningbo (CN)

(72) Inventors: Pengjun Wang, Ningbo (CN); Yuejun Zhang, Ningbo (CN); Zhidi Jiang, Ningbo (CN); Jianrui Li, Ningbo (CN)

(73) Assignee: Ningbo University, Ningbo (CN)

( * ) Notice: Subject to any disclaimer, the term of this patent is extended or adjusted under 35 U.S.C. 154(b) by 0 days.

(21) Appl. No.: 14/217,510

(22) Filed: Mar. 18, 2014

(65) Prior Publication Data

US 2014/0266296 A1  Sep. 18, 2014

(30) Foreign Application Priority Data

Mar. 18, 2013 (CN) .......................... 2013 1 0087145

(51) Int. Cl.
*H03K 19/00* (2006.01)
*H03K 19/177* (2006.01)

(52) U.S. Cl.
CPC .............................. *H03K 19/17768* (2013.01)
USPC ................................................. 326/8; 326/38

(58) Field of Classification Search
USPC .................... 326/8, 9, 14, 38, 63, 68
See application file for complete search history.

(56) References Cited

U.S. PATENT DOCUMENTS

| 7,681,103 B2* | 3/2010 | Devadas et al. | 714/752 |
|---|---|---|---|
| 8,274,306 B1* | 9/2012 | Garcia | 326/8 |
| 2009/0222672 A1* | 9/2009 | Clarke et al. | 713/189 |
| 2012/0106235 A1* | 5/2012 | Christensen et al. | 365/149 |
| 2013/0106461 A1* | 5/2013 | Ficke et al. | 326/8 |
| 2014/0035613 A1* | 2/2014 | Bucci et al. | 326/8 |
| 2014/0091832 A1* | 4/2014 | Gotze et al. | 326/8 |

* cited by examiner

*Primary Examiner* — Don Le
(74) *Attorney, Agent, or Firm* — Matthias Scholl P.C.; Matthias Scholl

(57) ABSTRACT

A reconfigurable multi-port physical unclonable functions (RM-PUFs) circuit, including: an input signal interface, a first control circuit module, at least two RM-PUFs circuit units, and an output signal interface. Each RM-PUFs circuit unit includes a second control circuit module, an input module, an output module, and a deviation generation module. The input signal interface is connected to the first control circuit module, the first control circuit module is connected to the RM-PUFs circuit units, and the RM-PUFs circuit units are connected to the output signal interface.

7 Claims, 13 Drawing Sheets

RECONFIGURABLE MULTI-PORT PHYSICAL UNCLONABLE FUNCTIONS CIRCUIT

CROSS-REFERENCE TO RELATED APPLICATIONS

Pursuant to 35 U.S.C. §119 and the Paris Convention Treaty, this application claims the benefit of Chinese Patent Application No. 201310087145.5 filed Mar. 18, 2013, the contents of which are incorporated herein by reference. Inquiries from the public to applicants or assignees concerning this document or the related applications should be directed to: Matthias Scholl P. C., Attn.: Dr. Matthias Scholl Esq., 14781 Memorial Drive, Suite 1319, Houston, Tex. 77079.

BACKGROUND OF THE INVENTION

1. Field of the Invention

The invention relates to a chip key generation circuit, and more particularly to a reconfigurable multi-port physical unclonable functions (RM-PUFs) circuit.

2. Description of the Related Art

PUFs technology, namely chip DNA technology, is a "biometric" identification technology in the chip field. The PUFs technology extracts the process deviation (including the thickness of the oxide layer, W/L, and random ion doping) inevitably produced in the chip manufacturing process to generate infinite and specific keys that are unpredictable, unordered, and permanent, and even the chip manufacturer is unable to imitate. The PUFs circuit dynamically extracts the infinite specific keys from the chip, and these keys can be widely applied in security and anti-counterfeit of the chip. PUFs technology is capable of improving the degree of the security and the reliability of the chip and the chip system, and has been widely applied in the field of the security and anti-counterfeit of the chip.

As the ID generated based on the security protocol of PUFs is unique and unclonable, the PUFs circuit has prominent advantages in aspects including defending against physical attacks, side-channel attacks, and lightweight protocol attacks. However, a typical PUFs circuit outputs the key via one port and is capable of only outputting one key at one clock cycle, the running speed thereof is relatively low. Besides, the extracted process deviation inevitably produced in the chip manufacturing process by the PUFs circuit is unique, which results in that the output key of the PUFs circuit is constant and is not reconfigurable. When the products (for example the chip) are required to change the key, the whole PUFs circuit is required to replace, thereby resulting in a high production cost.

SUMMARY OF THE INVENTION

In view of the above-described problems, it is one objective of the invention to provide are configurable multi-port physical unclonable functions (RM-PUFs) circuit that is capable of flexibly changing the output keys, has a low production cost and high running speed.

To achieve the above objective, in accordance with one embodiment of the invention, there is provided a RM-PUFs circuit. The circuit comprises: an input signal interface; a first control circuit module; at least two RM-PUFs circuit units, each RM-PUFs circuit unit comprising a second control circuit module, an input module, an output module, and a deviation generation module; and an output signal interface. The second control circuit module is provided with an enable signal input terminal, an excitation signal output terminal, a control signal output terminal, and a key port number output terminal. The input module is provided with an external signal input terminal, an excitation signal input terminal, and a signal output terminal. The output module is provided with a port number input terminal, a signal input terminal, and a signal output terminal. The deviation generation module is provided with a control signal terminal, a signal input terminal, and a signal output terminal. The input signal interface is connected to the first control circuit module, the first control circuit module is connected to the RM-PUFs circuit units, and the RM-PUFs circuit units are connected to the output signal interface. The excitation signal output terminal of the second control circuit module is connected to the excitation signal input terminal of the input module. The key port number output terminal of the second control circuit module is connected to the port number input terminal of the output module. The control signal output terminal of the second control circuit module is connected to the control signal terminal of the deviation generation module. The signal output terminal of the input module is connected to the signal input terminal of the deviation generation module. The signal output terminal of the deviation generation module is connected to the signal input terminal of the output module. Access signals of the external signal input terminal of the input module comprise a data signal, an address signal, and a control voltage signal.

In a class of this embodiment, the input module comprises: a first D flip-flop, a second D flip-flop, and a third D flip-flop. The first D flip-flop is accessed with the data signal, the second D flip-flop is accessed with the address signal, and the third D flip-flop is accessed with the control voltage signal and a first clock signal. The deviation generation module comprises: a register file, an oscillator, and N D flip-flop sets with each set formed by two series connected D flip-flop. The register file is connected to the first D flip-flop, the second D flip-flop, the oscillator, and the N D flip-flop sets. The oscillator is connected to the third D flip-flop and a first D flip-flop of each D flip-flop set. A second D flip-flop of each D flip-flop set is input with the first clock signal. An output signal of the oscillator is a second clock signal. The output module comprises N output units, each output unit comprises a latch and a FIFO output circuit, and the latch and the FIFO output circuit are series connected. The latch of each of the N output units and the second D flip-flop of each of the N D flip-flop sets is connected, respectively. The second control circuit module is connected to the first D flip-flop, the second D flip-flop, the third D flip-flop, and the FIFO output circuit of each of the N output units, respectively. The first clock signal has a frequency of between 0 and 50 MHz, and the second clock signal has a frequency of between 500 MHz and 1 GHz, N≥2.

In a class of this embodiment, the oscillator comprises: a differential delay circuit, a level shifter, a duty cycle circuit, and a frequency divider. The differential delay circuit is provided with a control voltage signal input terminal, a first signal output terminal, a second signal output terminal, and a ground terminal. The level shifter is provided with a first signal input terminal, a second signal input terminal, a first signal output terminal, a second signal output terminal, a DC voltage signal input terminal, and a ground terminal. The duty cycle circuit is provided with a first signal input terminal, a second signal input terminal, a DC voltage signal input terminal, and a ground terminal. The first signal output terminal of the differential delay circuit is connected to the first signal input terminal of the level shifter, and the second signal output terminal of the differential delay circuit is connected to the second signal input terminal of the level shifter. The first signal output terminal of the level shifter is connected to the first signal input terminal of the duty cycle circuit, and the second signal output terminal of the level shifter is connected to the second signal input terminal of the duty cycle circuit. The signal output terminal of the duty cycle circuit is connected to the signal input terminal of the frequency divider. The ground terminal of the differential delay circuit and the ground terminal of the level shifter are connected to the ground terminal of the duty cycle circuit. The DC voltage signal input terminal of the level shifter is connected to the DC voltage signal input terminal of the duty cycle circuit. The control voltage signal input terminal of the differential delay circuit is connected to the signal input terminal of the oscillator. The signal output terminal of the frequency divider is connected to the signal output terminal of the oscillator.

In a class of this embodiment, the differential delay circuit comprises 2n+1 differential delay units. Each differential delay unit is provided with a first signal input terminal, a second signal input terminal, a first signal output terminal, a second signal output terminal, a control voltage signal input terminal, and a ground terminal. Control voltage signal input terminals of the 2n+1 differential delay units are connected and a connecting terminal thereof functions as the control voltage signal input terminal of the differential delay circuit. Ground terminals of the 2n+1 differential delay units are connected and a connecting terminal thereof functions as the ground terminal of the differential delay circuit. The first signal output terminal of a former differential delay unit of the 2n+1 differential delay units is connected to the first signal input terminal of a latter differential delay unit. The second signal output terminal of a former differential delay unit of the 2n+1 differential delay units is connected to the second signal input terminal of a latter differential delay unit. The first signal output terminal of the last differential delay unit of the 2n+1 differential delay units is connected to the first signal input terminal of the first differential delay unit of the 2n+1 differential delay units. The second signal output terminal of the last differential delay unit of the 2n+1 differential delay units is connected to the second signal input terminal of the first differential delay unit of the 2n+1 differential delay units. The first signal output terminal of the last differential delay unit of the 2n+1 differential delay units functions as the first signal output terminal of the differential delay circuit. The second signal output terminal of the last differential delay unit of the 2n+1 differential delay units functions as the second signal output terminal of the differential delay circuit.

In a class of this embodiment, the differential delay unit comprises: a first PMOS, a second PMOS, a first NMOS, and a second NMOS. A drain of the first PMOS and a drain of the second PMOS are connected and a connecting terminal thereof functions as the control voltage signal input terminal of the differential delay unit. A grid of the first PMOS, a source of the second PMOS, and a drain of the second NMOS are connected and a connecting terminal thereof functions as the first signal output terminal of the differential delay unit. A source of the first PMOS, a grid of the second PMOS, and a drain of the first NMOS are connected and a connecting terminal thereof functions as the second signal output terminal of the differential delay unit. A source of the first NMOS and a source of the second NMOS are connected and a connecting terminal thereof functions as the grounding terminal of the differential delay unit. A grid of the first NMOS functions as the first signal input terminal of the differential delay unit. A grid of the second NMOS functions as the second signal input terminal of the differential delay unit. The level shift comprises a third PMOS, a fourth PMOS, a fifth PMOS, a sixth PMOS, a third NMOS, a fourth NMOS, a fifth NMOS, a sixth NMOS, a first inverter, and a second inverter. A drain of the third PMOS, a drain of the fourth PMOS, a drain of the fifth PMOS, and a drain of the sixth PMOS are connected and a connecting terminal thereof functions as the DC voltage signal input terminal of the level shifter. A grid of the third PMOS, a source of the fourth PMOS, and a drain of the fourth NMOS are connected and a connecting terminal thereof functions as the first signal output terminal of the level shifter. A source of the third PMOS, a drain of the third NMOS, and a grid of the fourth PMOS are connected. A grid of the third NMOS and an input terminal of the first inverter are connected and a connecting terminal thereof functions as the first signal input terminal of the level shifter. An output terminal of the first inverter and a grid of the fourth NMOS are connected. A source of the third NMOS, a source of the fourth NMOS, a source of the fifth NMOS, and a source of the sixth NMOS are connected and a connecting terminal thereof functions as the ground terminal of the level shifter. A grid of the fifth PMOS, a source of the sixth PMOS, and a drain of the sixth NMOS are connected and a connecting terminal thereof functions as the second signal output terminal of the level shifter. A source of the fifth PMOS, a drain of the fifth NMOS, and a grid of the sixth PMOS are connected. A grid of the fifth NMOS and an input terminal of the second inverter are connected and a connecting terminal functions as the second signal terminal of the level shifter. An output terminal of the second inverter is connected to the grid of the sixth NMOS. The duty cycle circuit comprises a seventh PMOS, an eighth PMOS, a seventh NMOS, and an eighth NMOS. A drain of the seventh NMOS and a drain of the seventh PMOS are connected and a connecting terminal thereof functions as the DC voltage signal input terminal of the duty cycle circuit. A source of the seventh NMOS, a source of the seventh PMOS, a drain of the eighth NMOS, and a drain of the eighth PMOS are connected and a connecting terminal thereof functions as the signal output terminal of the duty cycle circuit. A source of the eighth NMOS and a source of the eighth PMOS are connected and a connecting terminal thereof functions as the ground terminal of the duty cycle circuit. A grid of the seventh NMOS functions as the first signal input terminal of the duty cycle circuit and a grid of the eighth NMOS functions as the second signal input terminal of the duty cycle circuit.

In a class of this embodiment, the register file comprises: a decoding circuit module, a memory cell array, a sense amplifier, a selector, a latch, a third control circuit module, and a FIFO output circuit. The decoding circuit module comprises: a primary decoding circuit unit and a secondary decoding circuit unit. The primary decoding circuit unit comprises: a first flip-flop, a second flip-flop, a third flip-flop, a first decoder, a second decoder, and a third decoder. The first flip-flop is connected to the first decoder, the second flip-flop is connected to the second decoder, and the third flip-flop is connected to the third decoder. The secondary decoding circuit unit comprises: a three-input AND gate and a load driver module. The first decoder, the second decoder, and the third decoder are connected to three input terminals of the three-input AND gate, respectively. An output terminal of the three-input AND gate is connected to the load driver module, and the load driver module is connected to the memory cell array. The memory cell array is connected to the sense amplifier, the sense amplifier is connected to the selector, the selector is connected to the latch, and the latch is connected to the FIFO output circuit. The third control circuit module is connected to the memory cell array, the sense amplifier, the selector, and the latch, respectively. And the memory cell array comprises at least two memory cells.

In a class of this embodiment, the first flip-flop, the second flip-flop, and the third flip-flop are all D flip-flops. The first decoder and the second decoder are 2-4 decoders, and the third decoder is a 1-2 decoder.

Advantages of the invention are summarized as follows:

The input module of the RM-PUFs unit is accessed with the data signal, the address signal, and the external signal of the control voltage signal. The second control circuit module outputs the extraction signal to the input module and outputs the number of the key ports to the output module; the input module combines the extraction signal and the external signal and outputs the combined signals to the deviation generation module; the deviation generation module transmits the final data (output keys) to the output module; and the output module outputs corresponding key signals according to the received ports number signal and the output key signal. The reconfiguration of the output keys and the ports numbers of the PUFs circuit are implemented by controlling the external signal input in the input module and the number of the output key ports output from the second control circuit module. The RM-PUFs circuit is capable of flexibly changing the output keys and the number of the output ports, generating a plurality of keys in a clock cycle; the RM-PUFs circuit also has a low production cost and high running speed. 128-bit RM-PUFs circuit is realized at the TSMC 65 nm CMOS process. The area of the chip is 1.1 mm$^2$, a maximum clock frequency at 1.2 V is 0.8 GHz, and an average power consumption at the temperature of 27° C. is 7.2 mW. It is known from the test results that the RM-PUFs circuit has a high robustness to the variation of the external environment.

BRIEF DESCRIPTION OF THE DRAWINGS

The invention is described hereinbelow with reference to the accompanying drawings, in which.

DETAILED DESCRIPTION OF THE EMBODIMENTS

For further illustrating the invention, experiments detailing a RM-PUFs circuit are described below. It should be noted that the following examples are intended to describe and not to limit the invention.

A RM-PUFs circuit comprises: an input signal interface; a first control circuit module; at least two RM-PUFs circuit units, each RM-PUFs circuit unit comprising a second control circuit module, an input module, an output module, and a deviation generation module; and an output signal interface. The second control circuit module is provided with an enable signal input terminal, an excitation signal output terminal, a control signal output terminal, and a key port number output terminal. The input module is provided with an external signal input terminal, an excitation signal input terminal, and a signal output terminal. The output module is provided with a port number input terminal, a signal input terminal, and a signal output terminal. The deviation generation module is provided with a control signal terminal, a signal input terminal, and a signal output terminal. The input signal interface is connected to the first control circuit module, the first control circuit module is connected to the RM-PUFs circuit units, and the RM-PUFs circuit units are connected to the output signal interface. The excitation signal output terminal of the second control circuit module is connected to the excitation signal input terminal of the input module. The key port number output terminal of the second control circuit module is connected to the port number input terminal of the output module. The control signal output terminal of the second control circuit module is connected to the control signal terminal of the deviation generation module. The signal output terminal of the input module is connected to the signal input terminal of the deviation generation module. The signal output terminal of the deviation generation module is connected to the signal input terminal of the output module. Access signals of the external signal input terminal of the input module comprise a data signal, an address signal, and a control voltage signal.

Figure 1:
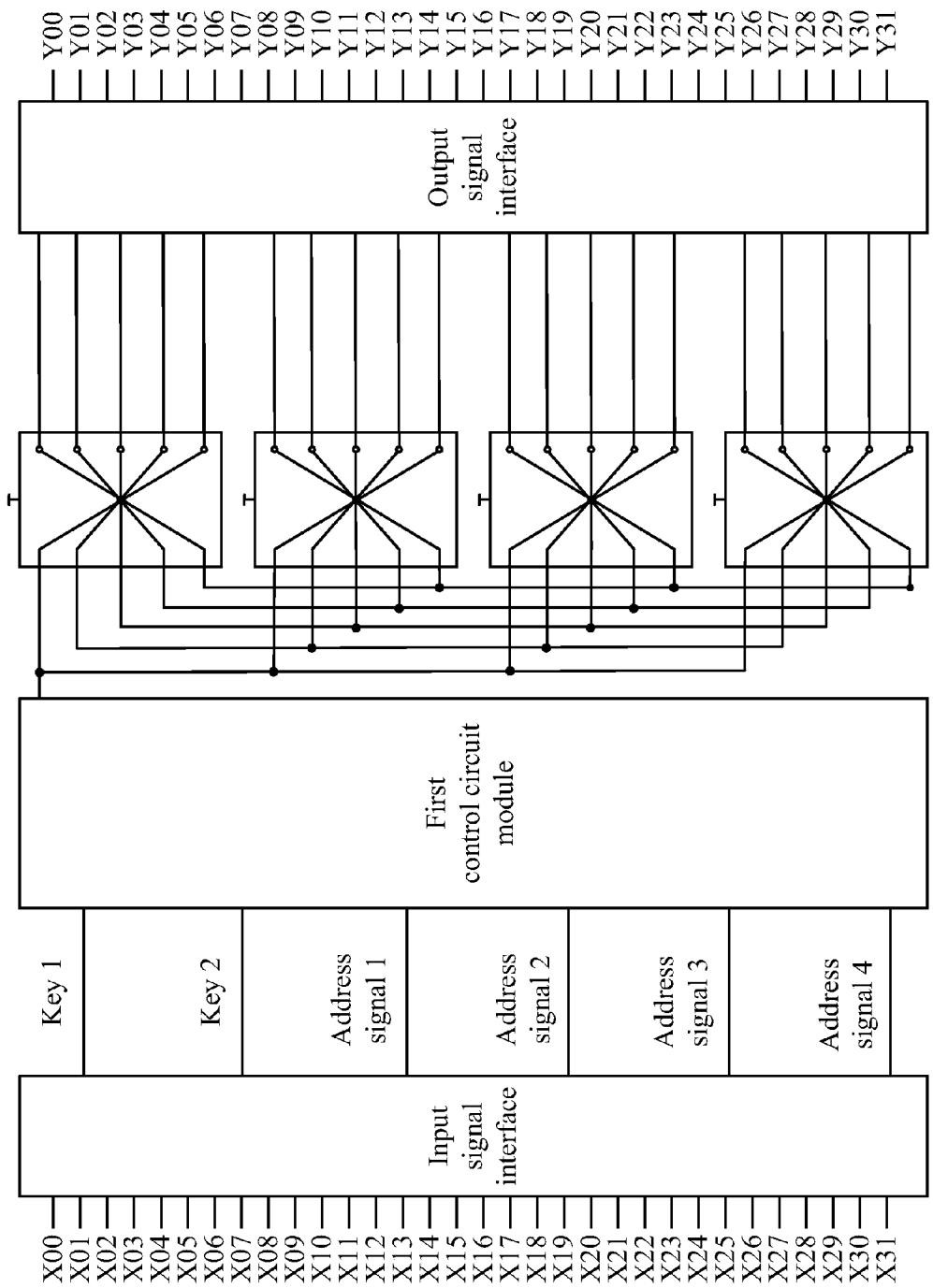
FIG. 1 is a circuit diagram of a four-port 128-bit PUFs circuit in accordance with one embodiment of the invention.

For example, when a reconfigurable multi-ports PUFs (RM-PUFs) circuit is provided with four RM-PUFs units, a four-port 128-bit PUFs circuit is generated, as shown in FIG. 1. The four-port 128-bit PUFs circuit comprises: an input signal interface; a first control circuit module; four RM-PUFs units, and an output signal interface. The input signal interface is connected to the first control circuit module, the first control circuit module is connected to the four RM-PUFs units, and the four RM-PUFs units are connected to the output signal interface.

Figure 2:
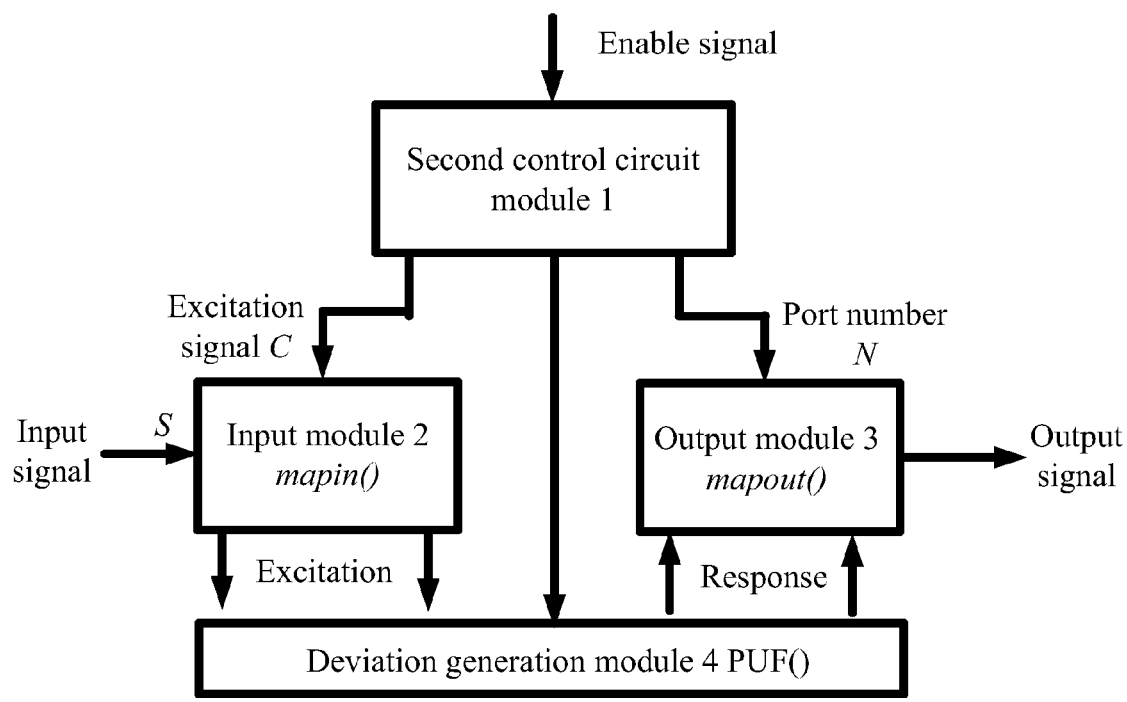
FIG. 2 is a schematic block diagram of a RM-PUFs unit in accordance with one embodiment of the invention.

As shown in FIG. 2, each RM-PUFs unit comprises: a second control circuit module 1, an input module 2, an output module 3, and a deviation generation module 4. The second control circuit module 1 is provided with an enable signal input terminal, an excitation signal output terminal, a control signal output terminal, and a key port number output terminal. The input module 2 is provided with an external signal input terminal, an excitation signal input terminal, and a signal output terminal. The output module 3 is provided with a port number input terminal, a signal input terminal, and a signal output terminal. The deviation generation module 4 is provided with a control signal terminal, a signal input terminal, and a signal output terminal. The excitation signal output terminal of the second control circuit module 1 is connected to the excitation signal input terminal of the input module 2. The key port number output terminal of the second control circuit module 1 is connected to the port number input terminal of the output module 3. The control signal output terminal of the second control circuit module 1 is connected to the control signal terminal of the deviation generation module 4. The signal output terminal of the input module 2 is connected to the signal input terminal of the deviation generation module 4. The signal output terminal of the deviation generation module 4 is connected to the signal input terminal of the output module 3. Access signals of the external signal input terminal of the input module 2 comprise a data signal, an address signal, and a control voltage signal.

Figure 3A:
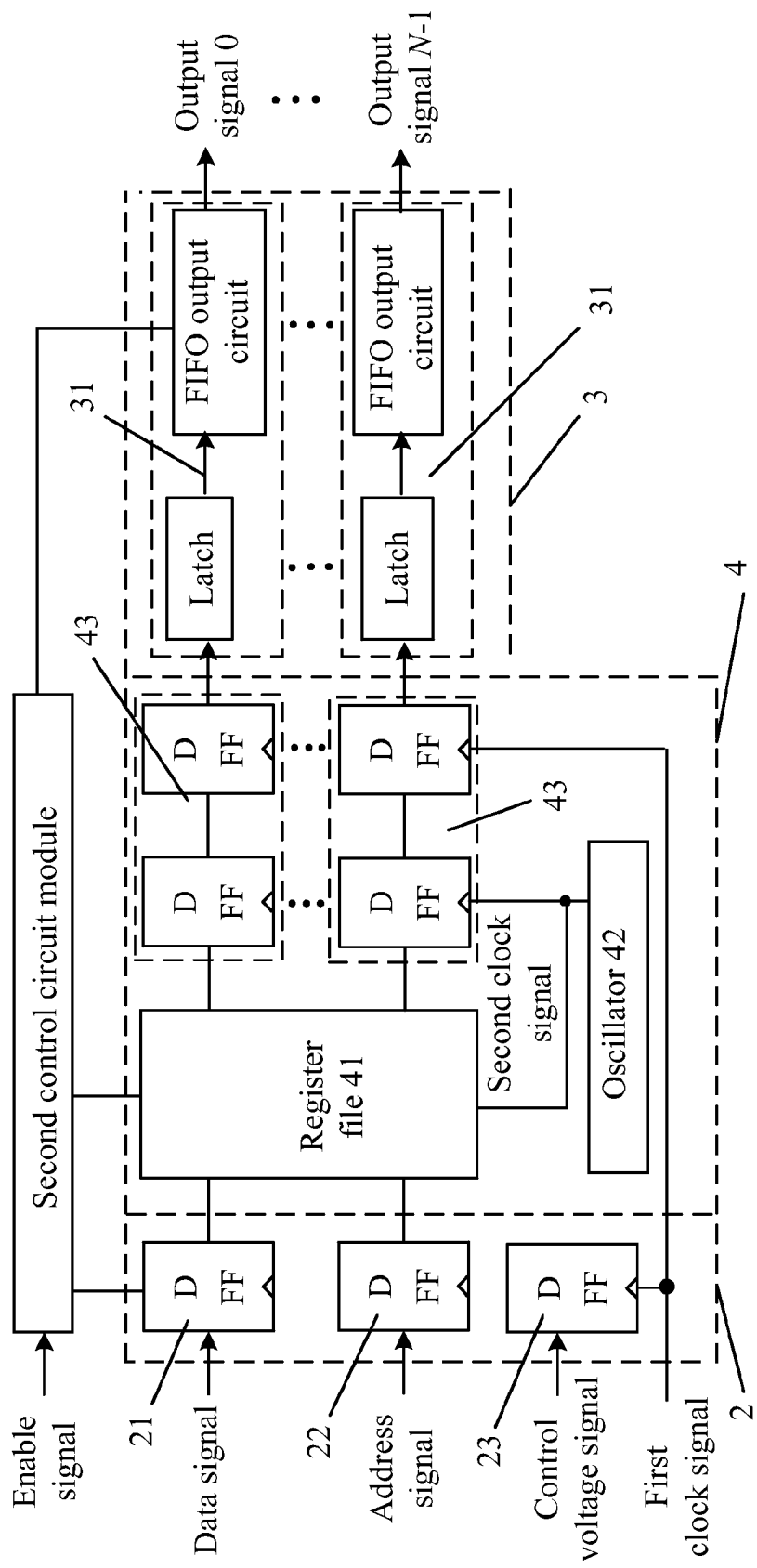
FIG. 3A is a circuit diagram of a RM-PUFs unit in accordance with one embodiment of the invention.
Figure 3B:
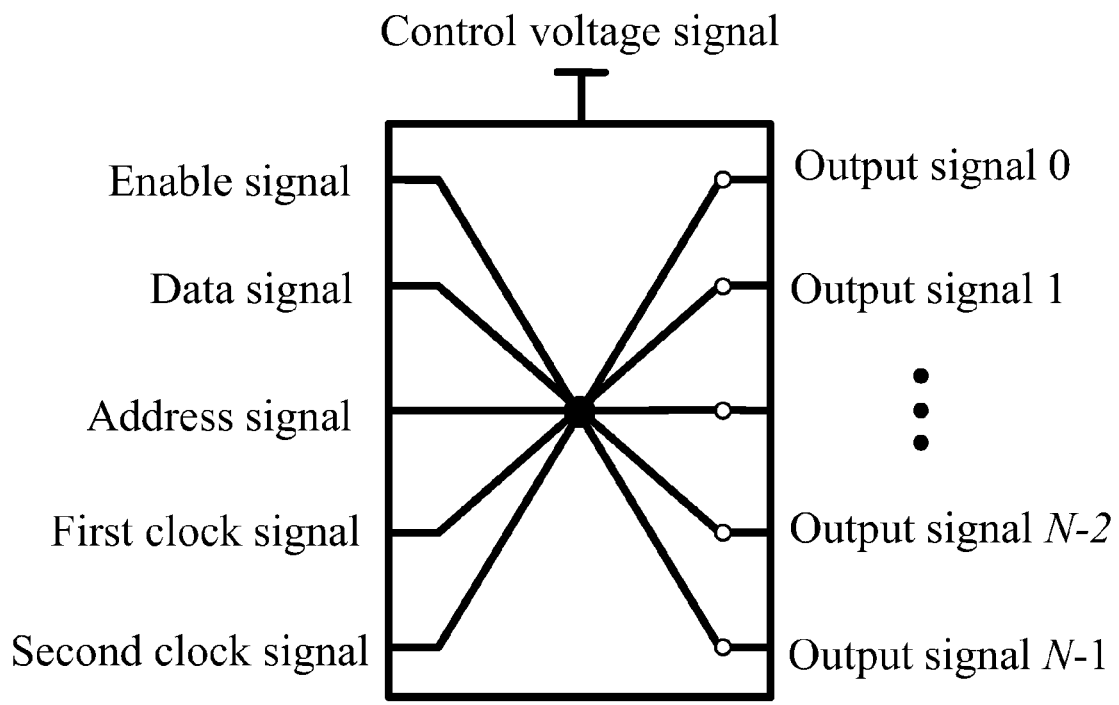
FIG. 3B is a symbol diagram of a RM-PUFs unit in accordance with one embodiment of the invention.

As shown in FIG. 3A, the input module 2 comprises: a first D flip-flop 21, a second D flip-flop 22, and a third D flip-flop 23. The first D flip-flop 21 is accessed with the data signal, the second D flip-flop 22 is accessed with the address signal, and the third D flip-flop 23 is accessed with the control voltage signal and a first clock signal. The deviation generation module 4 comprises: a register file 41, an oscillator 42, and N D flip-flop sets 43 with each set formed by two series connected D flip-flop. The register file 41 is connected to the first D flip-flop 21, the second D flip-flop 22, the oscillator 42, and the N D flip-flop sets 43. The oscillator 42 is connected to the third D flip-flop 23 and a first D flip-flop 21 of each D flip-flop set 43. A second D flip-flop 22 of each D flip-flop set 43 is input with the first clock signal. An output signal of the oscillator 42 is a second clock signal. The output module 3 comprises N output units 31, each output unit comprises a latch and a FIFO output circuit, and the latch and the FIFO output circuit are series connected. The latch of each of the N output units 31 and the second D flip-flop 22 of each of the N D flip-flop sets 43 is connected, respectively. The second control circuit module 1 is connected to the first D flip-flop 21, the second D flip-flop 22, the third D flip-flop 23, and the FIFO output circuit of each of the N output units 31, respectively. The first clock signal has a frequency of between 0 and 50 MHz, and the second clock signal has a frequency of between 500 MHz and 1 GHz, N≥2. A symbol figure of the RM-PUFs unit is shown in FIG. 3B.

Figure 4:
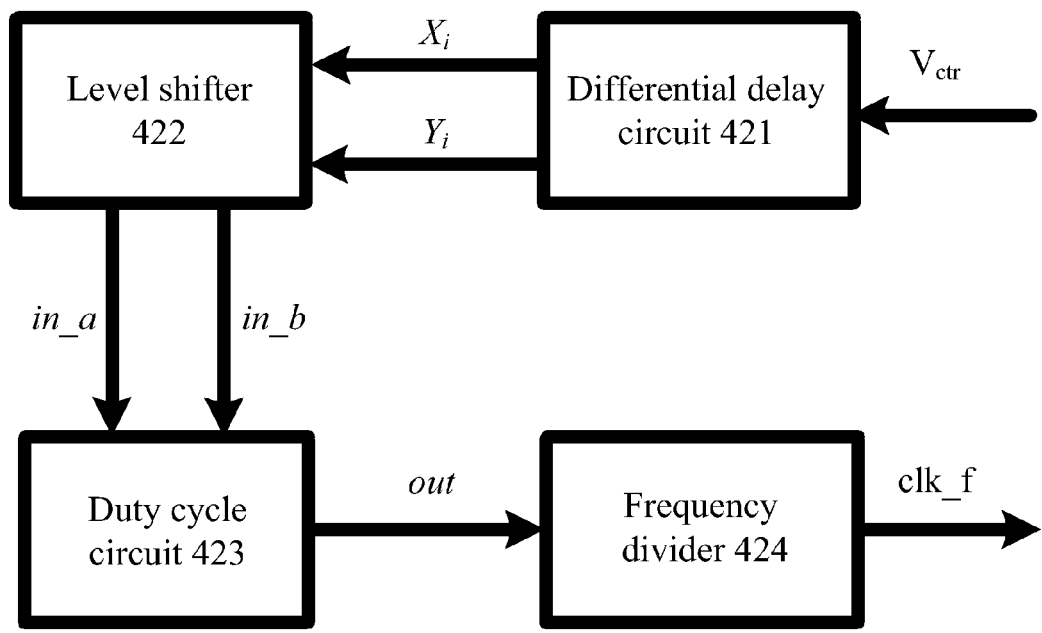
FIG. 4 is a schematic block diagram of an oscillator in accordance with one embodiment of the invention.

As shown in FIG. 4, the oscillator 42 comprises: a differential delay circuit 421, a level shifter 422, a duty cycle circuit 423, and a frequency divider 424. The differential delay circuit 421 is provided with a control voltage signal input terminal, a first signal output terminal, a second signal output terminal, and a ground terminal. The level shifter 422 is provided with a first signal input terminal, a second signal input terminal, a first signal output terminal, a second signal output terminal, a DC voltage signal input terminal, and a ground terminal. The duty cycle circuit 423 is provided with a first signal input terminal, a second signal input terminal, a DC voltage signal input terminal, and a ground terminal. The first signal output terminal of the differential delay circuit 421 is connected to the first signal input terminal of the level shifter 422, and the second signal output terminal of the differential delay circuit 421 is connected to the second signal input terminal of the level shifter 422. The first signal output terminal of the level shifter 422 is connected to the first signal input terminal of the duty cycle circuit 423, and the second signal output terminal of the level shifter 422 is connected to the second signal input terminal of the duty cycle circuit 423. The signal output terminal of the duty cycle circuit 423 is connected to the signal input terminal of the frequency divider 424. The ground terminal of the differential delay circuit 421 and the ground terminal of the level shifter 422 are connected to the ground terminal of the duty cycle circuit 423. The DC voltage signal input terminal of the level shifter 422 is connected to the DC voltage signal input terminal of the duty cycle circuit 423. The control voltage signal input terminal of the differential delay circuit 421 is connected to the signal input terminal of the oscillator 42. The signal output terminal of the frequency divider 424 is connected to the signal output terminal of the oscillator 42.

Figure 5:
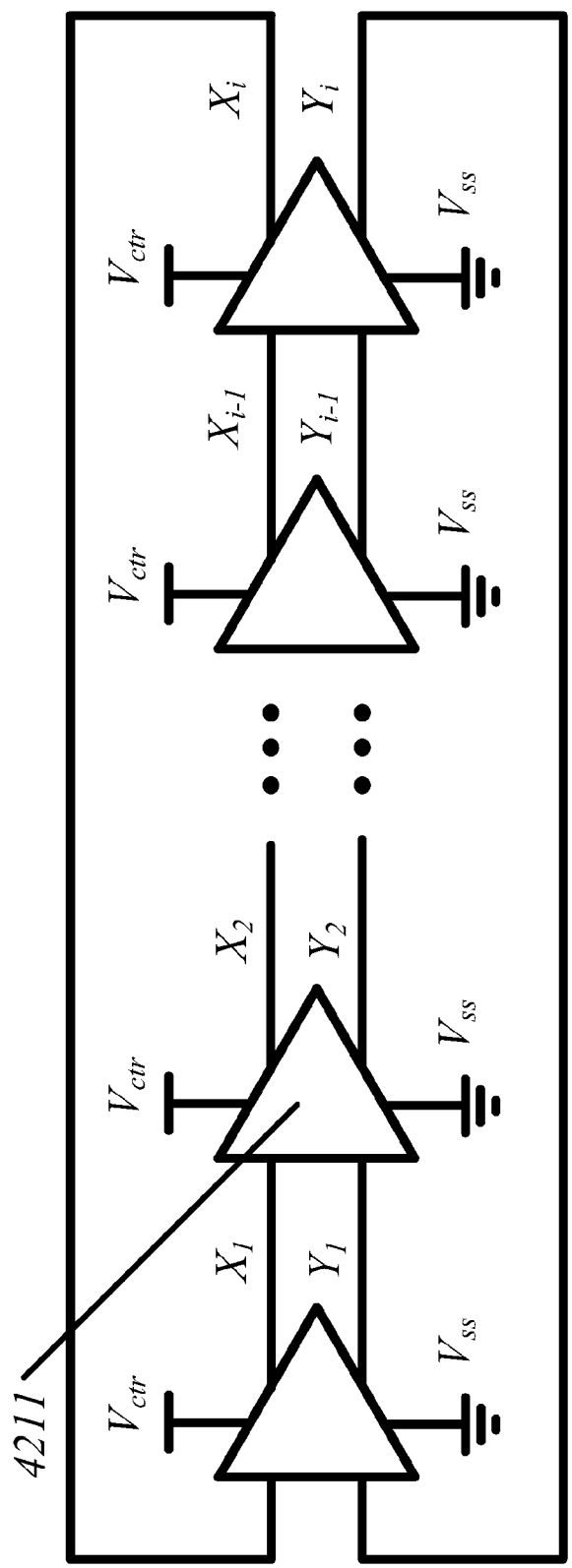
FIG. 5 is a circuit diagram of a differential delay circuit in accordance with one embodiment of the invention.

As shown in FIG. 5, the differential delay circuit 421 comprises 2n+1 differential delay units 4211. Each differential delay unit 4211 is provided with a first signal input terminal, a second signal input terminal, a first signal output terminal, a second signal output terminal, a control voltage signal input terminal, and a ground terminal. Control voltage signal input terminals of the 2n+1 differential delay units 4211 are connected and a connecting terminal thereof functions as the control voltage signal input terminal of the differential delay circuit 421. Ground terminals of the 2n+1 differential delay units 4211 are connected and a connecting terminal thereof functions as the ground terminal of the differential delay circuit 421. The first signal output terminal of a former differential delay unit 4211 of the differential delay circuit 421 is connected to the first signal input terminal of a latter differential delay unit 4211. The second signal output terminal of a former differential delay unit 4211 of the differential delay circuit 421 is connected to the second signal input terminal of a latter differential delay unit 4211. The first signal output terminal of the last differential delay unit 4211 of the differential delay circuit 421 is connected to the first signal input terminal of the first differential delay unit 4211 of the differential delay circuit 421. The second signal output terminal of the last differential delay unit 4211 of the differential delay circuit 421 is connected to the second signal input terminal of the first differential delay unit 4211 of the differential delay circuit 421. The first signal output terminal of the last differential delay unit 4211 of the differential delay circuit 421 functions as the first signal output terminal of the differential delay circuit 421. The second signal output terminal of the last differential delay unit 4211 of the differential delay circuit 421 functions as the second signal output terminal of the differential delay circuit 421, in which, n≥1.

Figure 6:
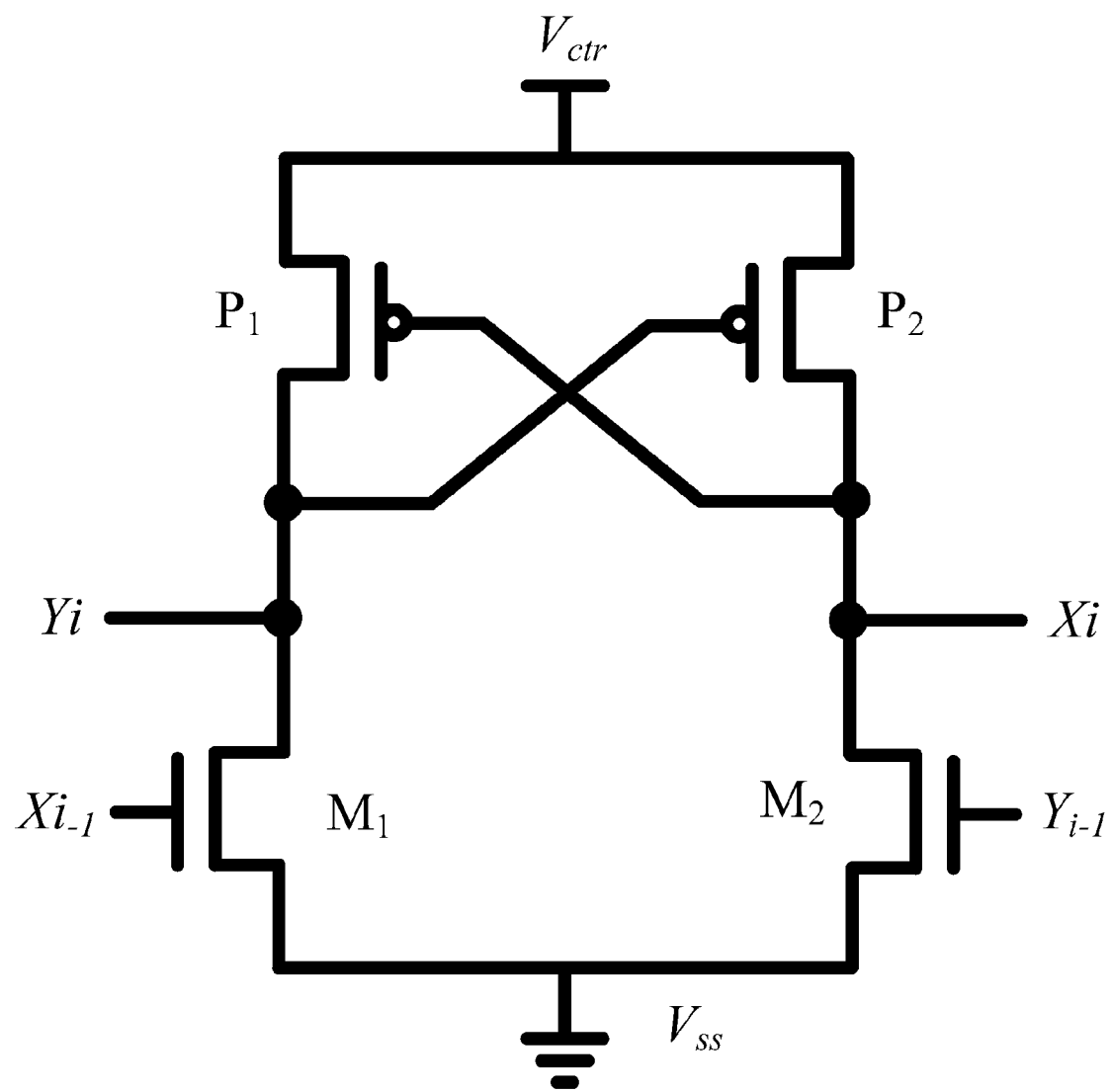
FIG. 6 is a circuit diagram of a differential delay unit in accordance with one embodiment of the invention.
Figure 7:
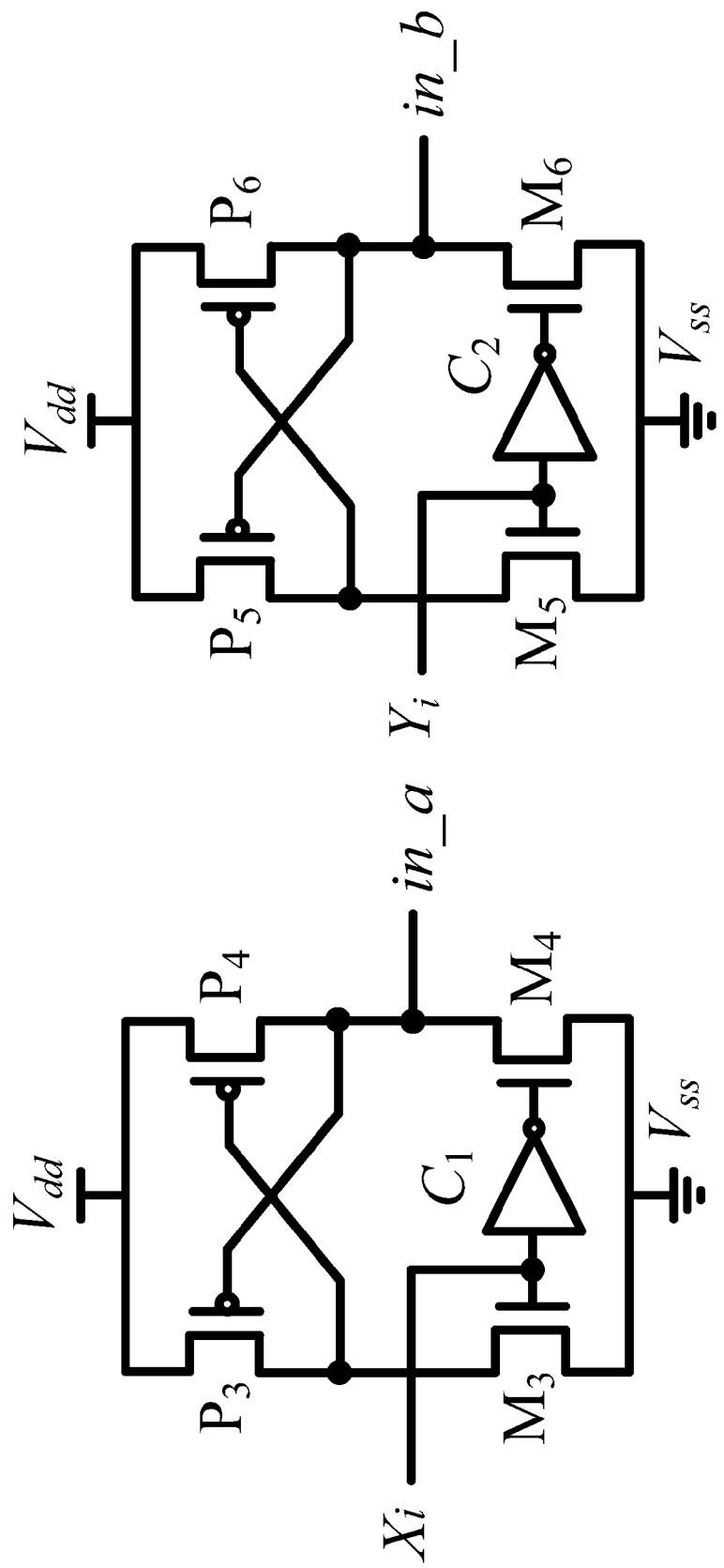
FIG. 7 is a circuit diagram of a level shifter in accordance with one embodiment of the invention.
Figure 8:
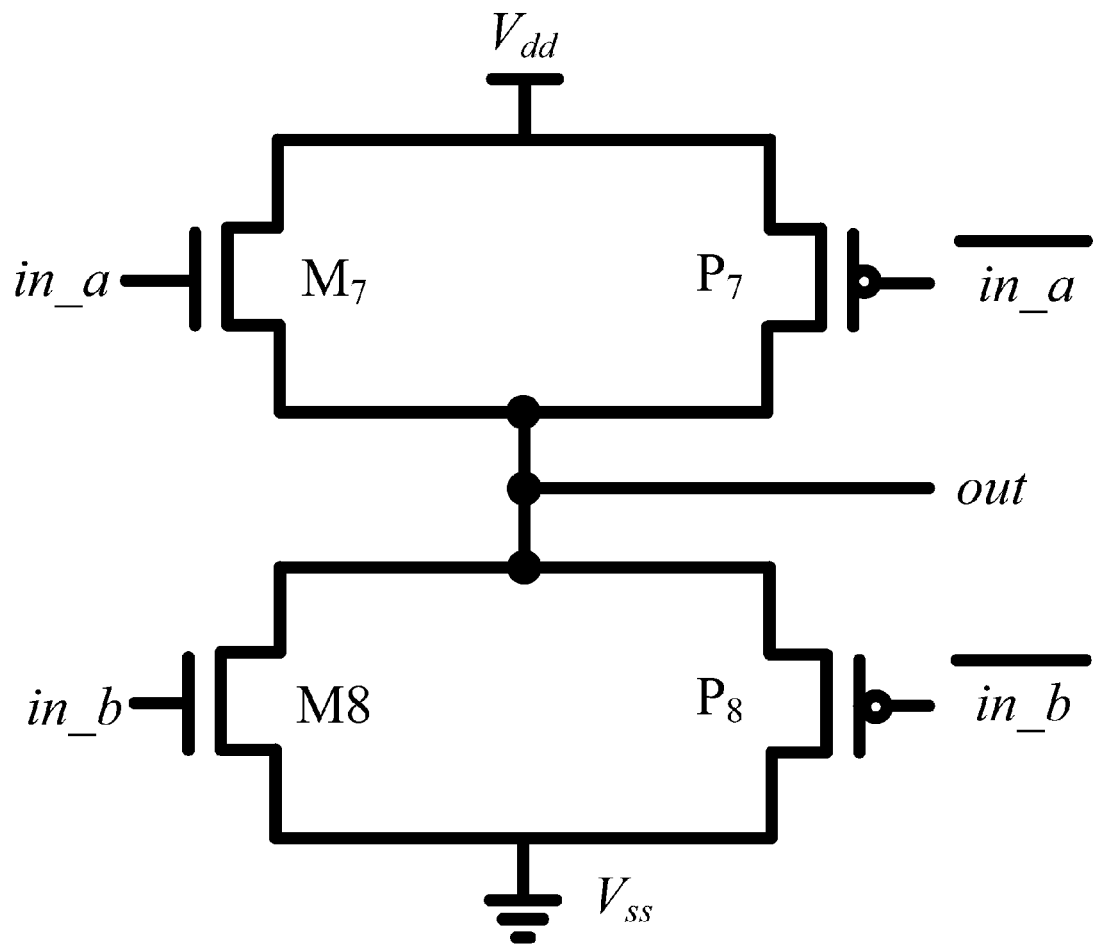
FIG. 8 is a circuit diagram of a duty cycle circuit in accordance with one embodiment of the invention.

As shown in FIGS. 6-8, the differential delay unit 4211 comprises: a first PMOS P1, a second PMOS P2, a first NMOS M1, and a second NMOS M2. A drain of the first PMOS P1 and a drain of the second PMOS P2 are connected and a connecting terminal thereof functions as the control voltage signal input terminal of the differential delay unit 4211. A grid of the first PMOS P1, a source of the second PMOS P2, and a drain of the second NMOS M2 are connected and a connecting terminal thereof functions as the first signal output terminal of the differential delay unit 4211. A source of the first PMOS P1, a grid of the second PMOS P2, and a drain of the first NMOS M1 are connected and a connecting terminal thereof functions as the second signal output terminal of the differential delay unit 4211. A source of the first NMOS M1 and a source of the second NMOS M2 are connected and a connecting terminal thereof functions as the grounding terminal of the differential delay unit 4211. A grid of the first NMOS M1 functions as the first signal input terminal of the differential delay unit 4211. A grid of the second NMOS M2 functions as the second signal input terminal of the differential delay unit 4211. The level shift comprises a third PMOS P3, a fourth PMOS P4, a fifth PMOS P5, a sixth PMOS P6, a third NMOS M3, a fourth NMOS M4, a fifth NMOS M5, a sixth NMOS M6, a first inverter C1, and a second inverter C2. A drain of the third PMOS P3, a drain of the fourth PMOS P4, a drain of the fifth PMOS P5, and a drain of the sixth PMOS P6 are connected and a connecting terminal thereof functions as the DC voltage signal input terminal of the level shifter 422. A grid of the third PMOS P3, a source of the fourth PMOS P4, and a drain of the fourth NMOS M4 are connected and a connecting terminal thereof functions as the first signal output terminal of the level shifter 422. A source of the third PMOS P3, a drain of the third NMOS M3, and a grid of the fourth PMOS P4 are connected. A grid of the third NMOS M3 and an input terminal of the first inverter C1 are connected and a connecting terminal thereof functions as the first signal input terminal of the level shifter. An output terminal of the first inverter C1 and a grid of the fourth NMOS M4 are connected. A source of the third NMOS M3, a source of the fourth NMOS M4, a source of the fifth NMOS M5, and a source of the sixth NMOS M6 are connected and a connecting terminal thereof functions as the ground terminal of the level shifter. A grid of the fifth PMOS P5, a source of the sixth PMOS P6, and a drain of the sixth NMOS M6 are connected and a connecting terminal thereof functions as the second signal output terminal of the level shifter 422. A source of the fifth PMOS P5, a drain of the fifth NMOS M5, and a grid of the sixth PMOS P6 are connected. A grid of the fifth NMOS M5 and an input terminal of the second inverter C2 are connected and a connecting terminal functions as the second signal terminal of the level shifter 422. An output terminal of the second inverter C2 is connected to the grid of the sixth NMOS M6. The duty cycle circuit 423 comprises a seventh PMOS P7, an eighth PMOS P8, a seventh NMOS M7, and an eighth NMOS M8. A drain of the seventh NMOS M7 and a drain of the seventh PMOS P7 are connected and a connecting terminal thereof functions as the DC voltage signal input terminal of the duty cycle circuit 423. A source of the seventh NMOS M7, a source of the seventh PMOS P7, a drain of the eighth NMOS M8, and a drain of the eighth PMOS P8 are connected and a connecting terminal thereof functions as the signal output terminal of the duty cycle circuit 423. A source of the eighth NMOS M8 and a source of the eighth PMOS P8 are connected and a connecting terminal thereof functions as the ground terminal of the duty cycle circuit 423. A grid of the seventh NMOS M7 functions as the first signal input terminal of the duty cycle circuit 423. And a grid of the eighth NMOS M8 functions as the second signal input terminal of the duty cycle circuit 423.

Figure 9:
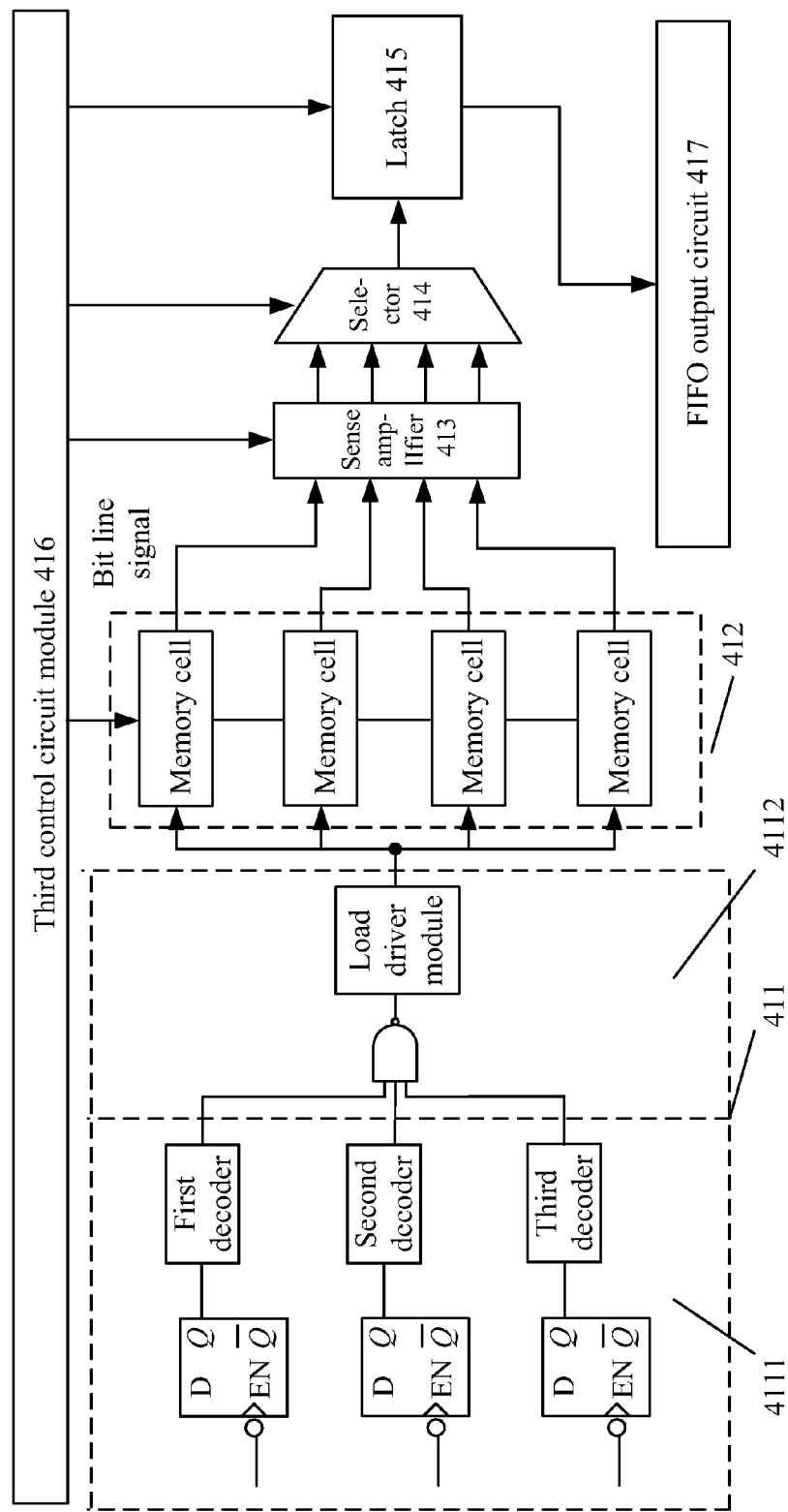
FIG. 9 is a circuit diagram of a register file in accordance with one embodiment of the invention.

The register file 41 utilizes a full-custom method in a TSMC 65 nm CMOS process to design a 4 reading and 2 writing register file 41. As shown in FIG. 9, the register file 41 comprises: a decoding circuit module 411, a memory cell array 412, a sense amplifier 413, a selector 414, a latch 415, a third control circuit module 416, and a FIFO output circuit 417. The decoding circuit module 411 comprises: a primary decoding circuit unit 4111 and a secondary decoding circuit unit 4112. The primary decoding circuit unit 4111 comprises: a first flip-flop, a second flip-flop, a third flip-flop, a first decoder, a second decoder, and a third decoder. The first flip-flop is connected to the first decoder, the second flip-flop is connected to the second decoder, and the third flip-flop is connected to the third decoder. The secondary decoding circuit unit 4112 comprises: a three-input AND gate and a load driver module. The first decoder, the second decoder, and the third decoder are connected to three input terminals of the three-input AND gate, respectively. An output terminal of the three-input AND gate is connected to the load driver module, and the load driver module is connected to the memory cell array 412. The memory cell array 412 is connected to the sense amplifier 413, the sense amplifier 413 is connected to the selector 414, the selector 414 is connected to the latch 415, and the latch 415 is connected to the FIFO output circuit 417. The third control circuit module 416 is connected to the memory cell array 412, the sense amplifier 413, the selector 414, and the latch 415, respectively. And the memory cell array 412 comprises at least two memory cells. The first flip-flop, the second flip-flop, and the third flip-flop are all D flip-flops. The first decoder and the second decoder are 2-4 decoders, and the third decoder is a 1-2 decoder.

Design principle of the invention is summarized as follows:

First of all, a reconfigurable multi-port PUFs circuit unit (RM-PUFs unit) is designed; and an element collection of the RM-PUFs unit is defined as $\{S, F, N, C, R_0R_1 \ldots R_n\}$, in which, S represents a state space, F represents a function space, N represents the number of the output key ports, C represents an excitation space, and $R_0R_1 \ldots R_n$ represents a response space. In the RM-PUFs unit, function space F is determined by the physical features of the circuit itself; and the state space S is determined by the external input signal, namely soft key. The output response of the RM-PUFs unit is determined by both the physical features of the circuit itself and the soft key, and an instantiation of model is represented as follows:

$$R(c) \leftarrow F(N,R(S,C)), R(c) \in R_0R_1 \ldots R_n \qquad (1)$$

The RM-PUFs unit is a new excitation-response mode after introducing the concept of the soft key, and a structure block diagram of a RM-PUFs unit, as shown in FIG. 1, is obtained by combining the definition and the conception of the circuit design of the RM-PUFs unit. The RM-RUFs unit comprises: the second control circuit module, the input module, the output module, and the deviation generation module. The excitation signal C and the number of the output key ports N are produced by the second control circuit module after the second control circuit module being accessed with an enable signal rconf( ); the soft key S and the excitation signal C are mapped from the input module to the deviation generation module via the function mapin( ), and the final data are output after being processed by the deviation generation module. The RM-PUFs unit is capable of changing the present state space S* by the soft key, changing the number of the output key ports N by the control signal, and reconfiguring the output keys and the number of the ports, thereby realizing the multi-ports reconfigurable function of the RM-PUFs unit.

Working process of the RM-PUFs unit comprises: a configuration phase, an input phase, a reconfiguration phase, and an output phase;

1. the configuration phase comprises initially configuring an internal register of the RM-PUFs unit, the internal register comprising the soft key S, the excitation signal C, and the number of the output key ports N;
2. the input phase comprises: inputting the excitation signal C into the function rconf( ) after the configuration phase; making an output of the function rconf( ) as the input signal of the mapping function mapin( ); and making an output signal of the mapping function mapin( ) as the excitation signal of the PUF( ) of the deviation generation module;
3. the reconfiguration phase comprises: inputting the soft key into the RM-PUFs unit via the input module state( ), changing the internal state S of the RM-PUFs into the state S*, thereby reconfiguring the output response of the RM-PUFs unit; and
4. the output phase comprises: receiving the output signal from the deviation generation module PUF( ) by the output module, and outputting N excitation/response pairs (C*, R*) of the RM-PUFs unit according to the number of the ports N output by rconf( ).

It is required to design four basic modules for the implementation of the RM-PUFs unit. The second control circuit module is implemented by a state machine; the input module and the output module utilizes an input network and an output network formed by D flip-flops, respectively; and the deviation generation module is implemented by the asynchronous clock. The soft keys are stored by the register file in the RM-PUFs unit for realizing the multi-port technology, and the soft keys in the register file are updated by the external circuit, thereby realizing the reconfigurable technology. The asynchronous clock comprises a first clock signal (clock s) and a second clock signal (clock 0; in which, the clock s has a frequency of between 0 MHz and 50 MHz and is provided by a global clock, and the clock f has a frequency of between 500 MHz and 1 GHz and is provided by the oscillator (VCO). To extract the process deviation to the utmost, the VCO circuit, a specific circuit of which is shown in FIG. 4, is implemented by a full-custom method in the TSMC 65 nm process. The VCO circuit comprises the differential delay circuit, the level shifter, the duty cycle circuit, and the frequency divider. The differential delay circuit is formed by connecting an odd number of differential delay units in a circle, a circuit diagram of the differential delay circuit is shown in FIG. 5, and a frequency $f_{osc}$ thereof meets the following equation:

$$f_{osc}=1/(2M-T_D) \quad (2)$$

in which, $T_D$ represents the delay time of the differential delay unit, M represents the number of the differential delay units (in this design, M=9), and the structure diagram of the differential delay unit is shown in FIG. 6. Because process deviation exits in the production process of the chip, VCO circuits of different chips output different frequencies in condition of the same control voltage $V_{ctr}$. The level shifter functions in converting the output frequency of the VCO circuit from $V_{ctr}$ into $V_{dd}$. The structure of the level shifter is shown in FIG. 7, and the working principle thereof is as follows: when $X_i=V_{ss}$, $M_3$ is cutoff, $M_4$ is connected, in_a=$V_{ss}$; and when $X_i=V_{ctr}$, $M_3$ is connected, $M_4$ is cutoff, $P_4$ is connected, and in_a=$V_{dd}$. The frequency of the in_a output clock is kept to be the same as the frequency of $X_i$; and in_a has a low level of $V_{ss}$ and a high level of $V_{dd}$. The VCO is one of the important indicators of the duty cycle circuit, and a desired duty cycle of the invention is at 50%. The duty cycle circuit has a structure shown in FIG. 8, and a working principle thereof is as follows: when in_a=$V_{dd}$, $M_7$ and $P_7$ are both connected, and out=$V_{dd}$. When in_a=$V_{ss}$, out is continuously at the high voltage until in_b=$Vd_{dd}$, $M_8$ and $P_8$ are both connected, and out=$V_{ss}$. When in_b=$V_{ss}$, out is continuously at the high voltage until in_b=$V_{dd}$. Because the in_a and in_b are both differential signals, the duty cycle is at 50%.

In the RM-PUF circuit unit, the first D flip-flop 21, the second D flip-flop 22, and the third D flip-flop 23 of the input module 2 are data receiving flip-flops. The first D flip-flop of each D flip-flop set 43 is a data sampling flip-flop, and the second D flip-flop of each D flip-flop set 43 is a data capturing flip-flop. The input data signals are stored in the register file 41 via the flip-flop. Data are sampled by the register file 41 under the control of the second clock signal and are stored by the data sampling flip-flop. The sampled values are serial output by the data capturing flip-flop under the control of the first clock signal. A final output logic value is determined by a frequency difference between the input data signal and the asynchronous clock. As the process deviation exists in the manufacture process, the frequency deviations of different chips are different in conditions of the same VCO structures, and the different output logic values are further resulted, and thus, the change of the output keys of the RM-PUFs is implemented by changing the input data signals.

In this example, $X_{00}, X_{01}, X_{02}, X_{03} \ldots X_{28}, X_{29}, X_{30}, X_{31}$ are input signals, comprising address signals and data signals. First of all, the input signal are stored in the internal SRAM via the input interface; second, the soft keys are stored in the register file 41 by the first control circuit module under the control of the first clock signal; third, the RM-PUFs unit is operated, and the soft key data are successively output by the register file 41 to the data sampling flip-flop under the control of the second clock signal, and the data stored by the data sampling flip-flop are recorded in the data capturing flip-flop; and finally, the data in the data sampling flip-flop are output as input keys $Y_{00}, Y_{01}, Y_{02}, Y_{03} \ldots Y_{28}, Y_{29}, Y_{30}, Y_{31}$ of the RM-PUFs unit. To reconfigure the keys, it is only required to update the input signals $X_{00}^*, X_{01}^*, X_{02}^*, X_{03}^* \ldots X_{28}^*, X_{29}^*, X_{30}^*, X_{31}^*$ and conduct the above process to output $Y_{00}^*, Y_{01}^*, Y_{02}^*, Y_{03}^* \ldots Y_{28}^*, Y_{29}^*, Y_{30}^*, Y_{31}^*$.

Figure 10:
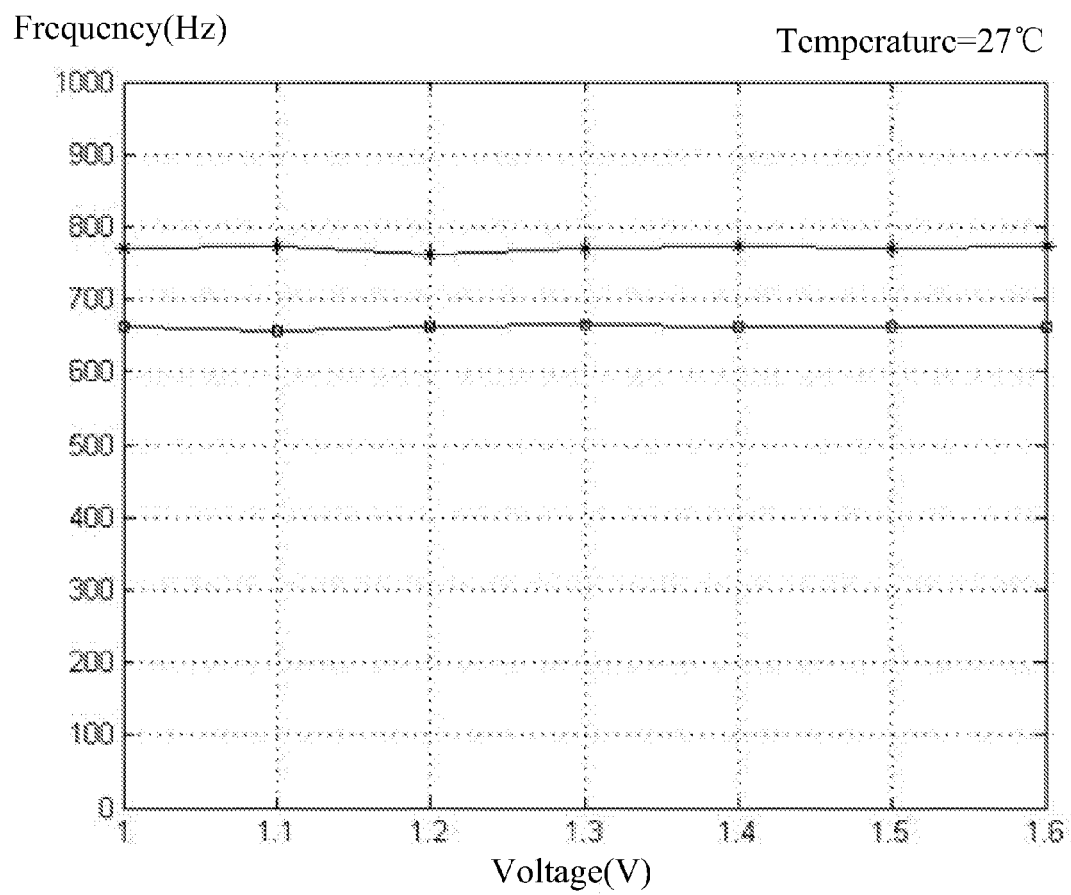
FIG. 10 is a voltage variation curve of an oscillator in a four-port 128-bit PUFs circuit of FIG. 9 in accordance with one embodiment of the invention.

The robustness of RM-PUFs to the supply voltage is a key performance indicator. The fluctuation of the supply voltage is very important for the reliability analysis of the excitation-response and is used to weigh the stability of the RM-PUFs in the voltage fluctuation environment. To evaluate the stability of RF-PUFs points on the VDD, the stability of the VCO of the chip at the frequency between 680 MHz and 780 MHz is tested, results of which is shown in FIG. 10. The voltage variation curve at between 1.0 V and 1.6 V indicates that the designed RM-PUFs circuit has a high robustness. The keys output by the four-port 128-bit PUFs chip are measured at the temperature of 27° C., as shown in Tables 1-2.

TABLE 1

Hamming distances output by RM-FUF circuit in condition of keys 1

| 67 | 65 | 65 | 60 | 65 | 45 | 55 | 64 | 62 | 63 | 66 | 70 | 60 | 70 | 63 |
|---|---|---|---|---|---|---|---|---|---|---|---|---|---|---|
| 0 | 62 | 62 | 59 | 70 | 64 | 68 | 59 | 77 | 62 | 63 | 63 | 65 | 61 | 64 |
| 0 | 0 | 88 | 71 | 66 | 68 | 60 | 67 | 71 | 64 | 57 | 59 | 65 | 59 | 62 |
| 0 | 0 | 0 | 61 | 62 | 62 | 66 | 67 | 65 | 60 | 61 | 67 | 59 | 69 | 58 |
| 0 | 0 | 0 | 0 | 71 | 65 | 69 | 64 | 78 | 61 | 66 | 56 | 60 | 56 | 59 |
| 0 | 0 | 0 | 0 | 0 | 60 | 64 | 63 | 65 | 62 | 61 | 69 | 61 | 73 | 54 |
| 0 | 0 | 0 | 0 | 0 | 0 | 58 | 63 | 71 | 62 | 55 | 57 | 63 | 59 | 72 |
| 0 | 0 | 0 | 0 | 0 | 0 | 0 | 67 | 61 | 60 | 61 | 65 | 65 | 61 | 66 |
| 0 | 0 | 0 | 0 | 0 | 0 | 0 | 0 | 64 | 67 | 58 | 56 | 66 | 62 | 63 |
| 0 | 0 | 0 | 0 | 0 | 0 | 0 | 0 | 0 | 71 | 60 | 68 | 66 | 62 | 69 |
| 0 | 0 | 0 | 0 | 0 | 0 | 0 | 0 | 0 | 0 | 59 | 67 | 65 | 63 | 58 |
| 0 | 0 | 0 | 0 | 0 | 0 | 0 | 0 | 0 | 0 | 0 | 50 | 62 | 54 | 63 |
| 0 | 0 | 0 | 0 | 0 | 0 | 0 | 0 | 0 | 0 | 0 | 0 | 56 | 12 | 77 |
| 0 | 0 | 0 | 0 | 0 | 0 | 0 | 0 | 0 | 0 | 0 | 0 | 0 | 44 | 23 |
| 0 | 0 | 0 | 0 | 0 | 0 | 0 | 0 | 0 | 0 | 0 | 0 | 0 | 0 | 65 |

TABLE 2

Hamming distances output by RM-FUF circuit in condition of keys 2

| 61 | 75 | 55 | 65 | 64 | 60 | 63 | 69 | 54 | 57 | 70 | 62 | 68 | 61 | 64 |
|---|---|---|---|---|---|---|---|---|---|---|---|---|---|---|
| 0 | 74 | 60 | 74 | 67 | 65 | 66 | 64 | 73 | 62 | 67 | 67 | 63 | 64 | 67 |
| 0 | 0 | 68 | 58 | 71 | 59 | 54 | 62 | 65 | 58 | 67 | 63 | 69 | 60 | 63 |
| 0 | 0 | 0 | 62 | 65 | 61 | 64 | 66 | 63 | 56 | 61 | 59 | 63 | 56 | 71 |
| 0 | 0 | 0 | 0 | 65 | 59 | 62 | 62 | 67 | 62 | 65 | 67 | 55 | 67 | 64 | 55 |
| 0 | 0 | 0 | 0 | 0 | 74 | 61 | 61 | 62 | 61 | 58 | 60 | 52 | 69 | 58 |
| 0 | 0 | 0 | 0 | 0 | 0 | 63 | 61 | 64 | 45 | 70 | 66 | 62 | 57 | 70 |
| 0 | 0 | 0 | 0 | 0 | 0 | 0 | 66 | 79 | 68 | 69 | 57 | 67 | 64 | 55 |
| 0 | 0 | 0 | 0 | 0 | 0 | 0 | 0 | 73 | 56 | 69 | 65 | 65 | 64 | 59 |
| 0 | 0 | 0 | 0 | 0 | 0 | 0 | 0 | 0 | 63 | 66 | 60 | 68 | 71 | 58 |
| 0 | 0 | 0 | 0 | 0 | 0 | 0 | 0 | 0 | 0 | 61 | 69 | 65 | 64 | 71 |
| 0 | 0 | 0 | 0 | 0 | 0 | 0 | 0 | 0 | 0 | 0 | 64 | 62 | 65 | 56 |
| 0 | 0 | 0 | 0 | 0 | 0 | 0 | 0 | 0 | 0 | 0 | 0 | 60 | 51 | 36 |
| 0 | 0 | 0 | 0 | 0 | 0 | 0 | 0 | 0 | 0 | 0 | 0 | 0 | 43 | 64 |
| 0 | 0 | 0 | 0 | 0 | 0 | 0 | 0 | 0 | 0 | 0 | 0 | 0 | 0 | 79 |

Figure 11:
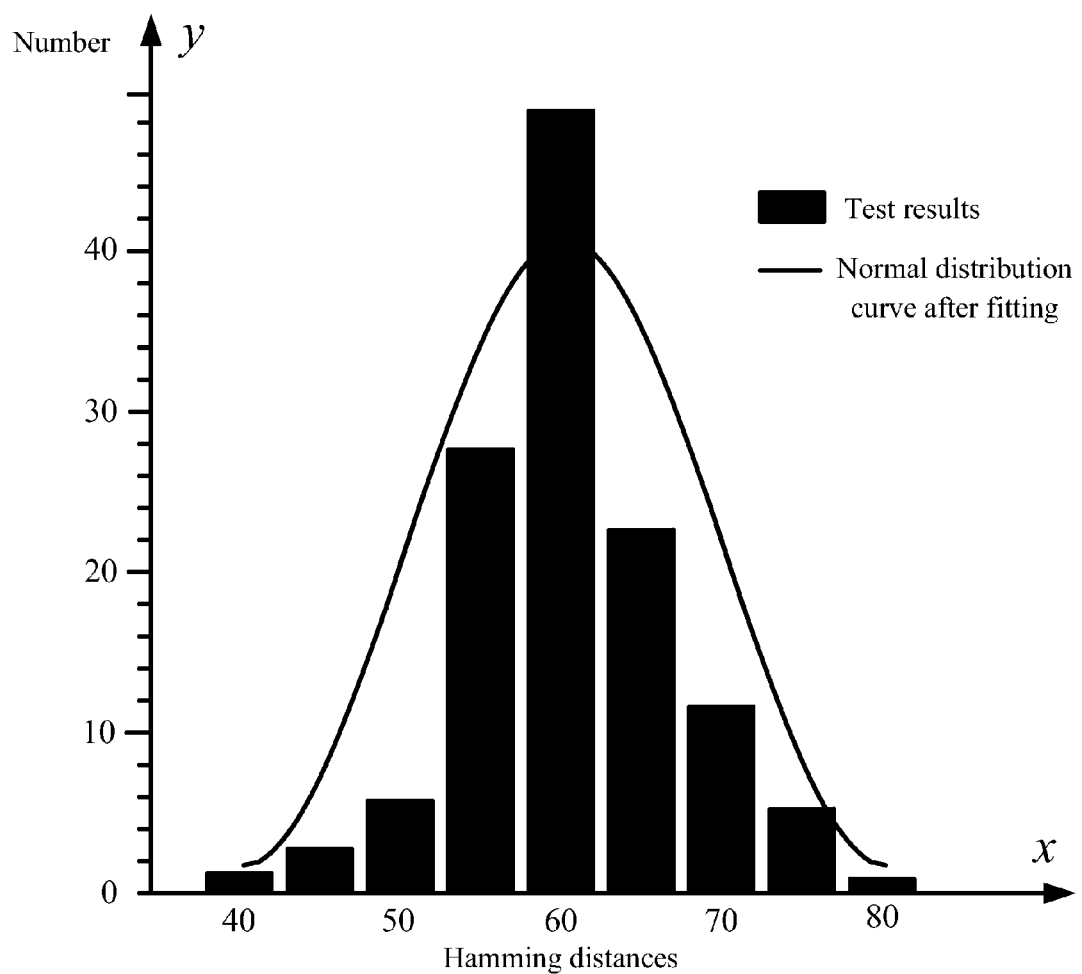
FIG. 11 is a first Hamming distance map output by a four-port 128-bit PUFs circuit in accordance with one embodiment of the invention.
Figure 12:
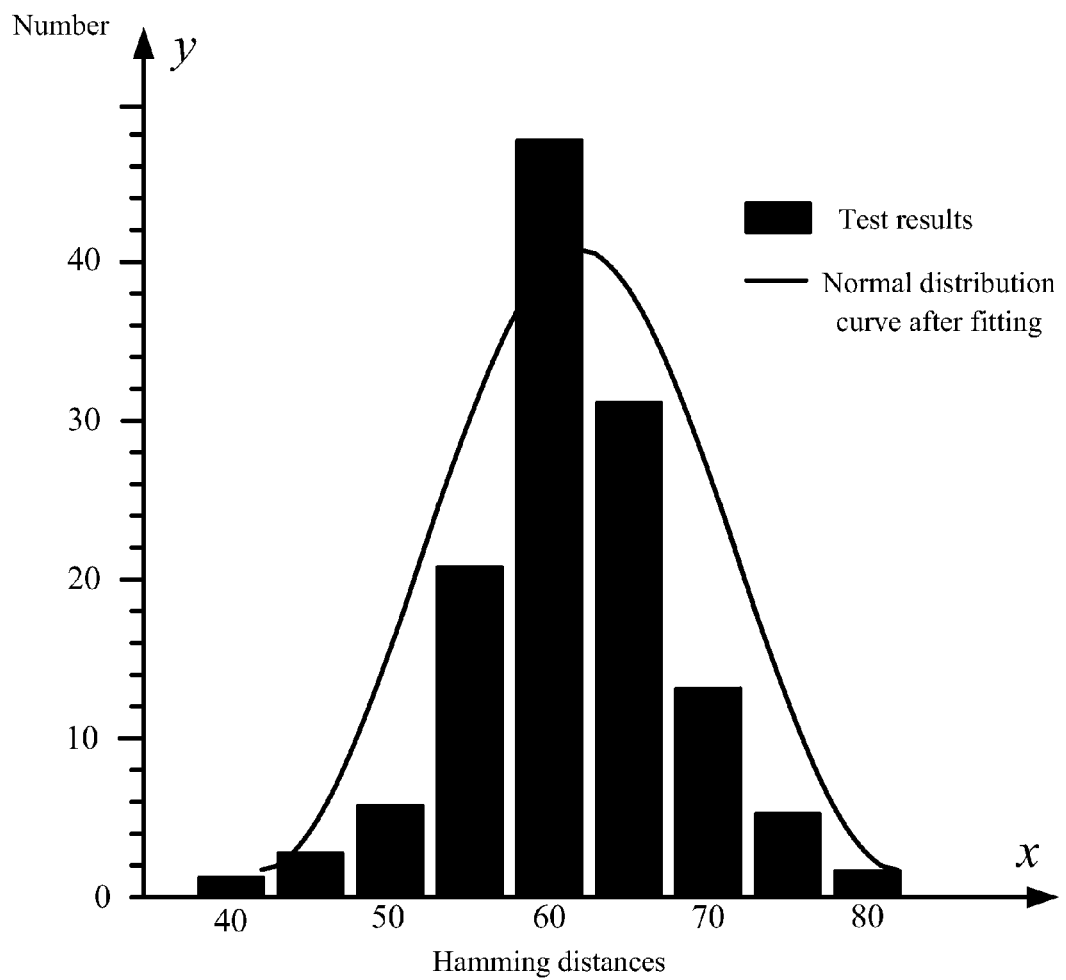
FIG. 12 is a second Hamming distance map output by a four-port 128-bit PUFs circuit in accordance with one embodiment of the invention.

The Hamming distances output by the RM-PUFs in condition of keys 1 are shown in FIG. 11, and the Hamming distances output by the RM-PUFs in condition of keys 2 are shown in FIG. 12. The Hamming distances basically coincide with the normal distribution, proving that the output keys have good randomness.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A reconfigurable multi-port physical unclonable functions (RM-PUFs) circuit, comprising:
   a) an input signal interface;
   b) a first control circuit module;
   c) at least two RM-PUFs circuit units, each RM-PUFs circuit unit comprising a second control circuit module, an input module, an output module, and a deviation generation module; and
   d) an output signal interface;
   wherein
   the second control circuit module is provided with an enable signal input terminal, an excitation signal output terminal, a control signal output terminal, and a key port number output terminal; the input module is provided with an external signal input terminal, an excitation signal input terminal, and a signal output terminal; the output module is provided with a port number input terminal, a signal input terminal, and a signal output terminal; and the deviation generation module is provided with a control signal terminal, a signal input terminal, and a signal output terminal;
   the input signal interface is connected to the first control circuit module, the first control circuit module is connected to the RM-PUFs circuit units, and the RM-PUFs circuit units are connected to the output signal interface;
   the excitation signal output terminal of the second control circuit module is connected to the excitation signal input terminal of the input module; the key port number output terminal of the second control circuit module is connected to the port number input terminal of the output module; the control signal output terminal of the second control circuit module is connected to the control signal terminal of the deviation generation module; the signal output terminal of the input module is connected to the signal input terminal of the deviation generation module; the signal output terminal of the deviation generation module is connected to the signal input terminal of the output module; and
   access signals of the external signal input terminal of the input module comprise a data signal, an address signal, and a control voltage signal.

2. The circuit of claim 1, wherein
   the input module comprises: a first D flip-flop, a second D flip-flop, and a third D flip-flop; the first D flip-flop is accessed with the data signal, the second D flip-flop is accessed with the address signal, and the third D flip-flop is accessed with the control voltage signal and a first clock signal;
   the deviation generation module comprises: a register file, an oscillator, and N D flip-flop sets with each set formed by two series connected D flip-flops, N≥2;
   the register file is connected to the first D flip-flop, the second D flip-flop, the oscillator, and the N D flip-flop sets; the oscillator is connected to the third D flip-flop and a first D flip-flop of each D flip-flop set; a second D flip-flop of each D flip-flop set is input with the first clock signal; and an output signal of the oscillator is a second clock signal;
   the output module comprises N output units, each output unit comprises a latch and a FIFO output circuit, and the latch and the FIFO output circuit are series connected; the latch of each of the N output units and the second D flip-flop of each of the N D flip-flop sets is connected, respectively;
   the second control circuit module is connected to the first D flip-flop, the second D flip-flop, the third D flip-flop, and the FIFO output circuit of each of the N output units, respectively; and
   the first clock signal has a frequency of between 0 and 50 MHz, and the second clock signal has a frequency of between 500 MHz and 1 GHz.

3. The circuit of claim 2, wherein
   the oscillator comprises: a differential delay circuit, a level shifter, a duty cycle circuit, and a frequency divider; the differential delay circuit is provided with a control voltage signal input terminal, a first signal output terminal, a second signal output terminal, and a ground terminal; the level shifter is provided with a first signal input terminal, a second signal input terminal, a first signal output terminal, a second signal output terminal, a DC voltage signal input terminal, and a ground terminal; the duty cycle circuit is provided with a first signal input terminal, a second signal input terminal, a DC voltage signal input terminal, and a ground terminal;
   the first signal output terminal of the differential delay circuit is connected to the first signal input terminal of the level shifter, and the second signal output terminal of the differential delay circuit is connected to the second signal input terminal of the level shifter;
   the first signal output terminal of the level shifter is connected to the first signal input terminal of the duty cycle circuit, and the second signal output terminal of the level shifter is connected to the second signal input terminal of the duty cycle circuit; and
   the signal output terminal of the duty cycle circuit is connected to the signal input terminal of the frequency divider; the ground terminal of the differential delay circuit and the ground terminal of the level shifter are connected to the ground terminal of the duty cycle circuit; the DC voltage signal input terminal of the level shifter is connected to the DC voltage signal input terminal of the duty cycle circuit; the control voltage signal input terminal of the differential delay circuit is connected to the signal input terminal of the oscillator; and the signal output terminal of the frequency divider is connected to the signal output terminal of the oscillator.

4. The circuit of claim 3, wherein
   the differential delay circuit comprises 2n+1 differential delay units; each differential delay unit is provided with a first signal input terminal, a second signal input terminal, a first signal output terminal, a second signal output terminal, a control voltage signal input terminal, and a ground terminal;
   control voltage signal input terminals of the 2n+1 differential delay units are connected and a connecting terminal thereof functions as the control voltage signal input terminal of the differential delay circuit; ground terminals of the 2n+1 differential delay units are connected and a connecting terminal thereof functions as the ground terminal of the differential delay circuit;
   the first signal output terminal of a former differential delay unit of the 2n+1 differential delay units is connected to the first signal input terminal of a latter differential delay unit; the second signal output terminal of a former differential delay unit of the 2n+1 differential delay units is connected to the second signal input terminal of a latter differential delay unit;

the first signal output terminal of the last differential delay unit of the 2n+1 differential delay units is connected to the first signal input terminal of the first differential delay unit of the 2n+1 differential delay units; the second signal output terminal of the last differential delay unit of the 2n+1 differential delay units is connected to the second signal input terminal of the first differential delay unit of the 2n+1 differential delay units;

the first signal output terminal of the last differential delay unit of the 2n+1 differential delay units functions as the first signal output terminal of the differential delay circuit; and the second signal output terminal of the last differential delay unit of the 2n+1 differential delay units functions as the second signal output terminal of the differential delay circuit.

5. The circuit of claim 4, wherein the differential delay unit comprises: a first PMOS, a second PMOS, a first NMOS, and a second NMOS; a drain of the first PMOS and a drain of the second PMOS are connected and a connecting terminal thereof functions as the control voltage signal input terminal of the differential delay unit; a grid of the first PMOS, a source of the second PMOS, and a drain of the second NMOS are connected and a connecting terminal thereof functions as the first signal output terminal of the differential delay unit; a source of the first PMOS, a grid of the second PMOS, and a drain of the first NMOS are connected and a connecting terminal thereof functions as the second signal output terminal of the differential delay unit; a source of the first NMOS and a source of the second NMOS are connected and a connecting terminal thereof functions as the grounding terminal of the differential delay unit; a grid of the first NMOS functions as the first signal input terminal of the differential delay unit; and a grid of the second NMOS functions as the second signal input terminal of the differential delay unit;

the level shift comprises a third PMOS, a fourth PMOS, a fifth PMOS, a sixth PMOS, a third NMOS, a fourth NMOS, a fifth NMOS, a sixth NMOS, a first inverter, and a second inverter; a drain of the third PMOS, a drain of the fourth PMOS, a drain of the fifth PMOS, and a drain of the sixth PMOS are connected and a connecting terminal thereof functions as the DC voltage signal input terminal of the level shifter; a grid of the third PMOS, a source of the fourth PMOS, and a drain of the fourth NMOS are connected and a connecting terminal thereof functions as the first signal output terminal of the level shifter; a source of the third PMOS, a drain of the third NMOS, and a grid of the fourth PMOS are connected; a grid of the third NMOS and an input terminal of the first inverter are connected and a connecting terminal thereof functions as the first signal input terminal of the level shifter; an output terminal of the first inverter and a grid of the fourth NMOS are connected; a source of the third NMOS, a source of the fourth NMOS, a source of the fifth NMOS, and a source of the sixth NMOS are connected and a connecting terminal thereof functions as the ground terminal of the level shifter; a grid of the fifth PMOS, a source of the sixth PMOS, and a drain of the sixth NMOS are connected and a connecting terminal thereof functions as the second signal output terminal of the level shifter; a source of the fifth PMOS, a drain of the fifth NMOS, and a grid of the sixth PMOS are connected; a grid of the fifth NMOS and an input terminal of the second inverter are connected and a connecting terminal functions as the second signal terminal of the level shifter; and an output terminal of the second inverter is connected to the grid of the sixth NMOS; and the duty cycle circuit comprises a seventh PMOS, an eighth PMOS, a seventh NMOS, and an eighth NMOS; a drain of the seventh NMOS and a drain of the seventh PMOS are connected and a connecting terminal thereof functions as the DC voltage signal input terminal of the duty cycle circuit; a source of the seventh NMOS, a source of the seventh PMOS, a drain of the eighth NMOS, and a drain of the eighth PMOS are connected and a connecting terminal thereof functions as the signal output terminal of the duty cycle circuit; a source of the eighth NMOS and a source of the eighth PMOS are connected and a connecting terminal thereof functions as the ground terminal of the duty cycle circuit; a grid of the seventh NMOS functions as the first signal input terminal of the duty cycle circuit; and a grid of the eighth NMOS functions as the second signal input terminal of the duty cycle circuit.

6. The circuit of claim 2, wherein the register file comprises: a decoding circuit module, a memory cell array, a sense amplifier, a selector, a latch, a third control circuit module, and a FIFO output circuit;

the decoding circuit module comprises: a primary decoding circuit unit and a secondary decoding circuit unit;

the primary decoding circuit unit comprises: a first flip-flop, a second flip-flop, a third flip-flop, a first decoder, a second decoder, and a third decoder; the first flip-flop is connected to the first decoder, the second flip-flop is connected to the second decoder, and the third flip-flop is connected to the third decoder;

the secondary decoding circuit unit comprises: a three-input AND gate and a load driver module; the first decoder, the second decoder, and the third decoder are connected to three input terminals of the three-input AND gate, respectively; an output terminal of the three-input AND gate is connected to the load driver module, and the load driver module is connected to the memory cell array; and the memory cell array is connected to the sense amplifier, the sense amplifier is connected to the selector, the selector is connected to the latch, and the latch is connected to the FIFO output circuit; the third control circuit module is connected to the memory cell array, the sense amplifier, the selector, and the latch, respectively; and the memory cell array comprises at least two memory cells.

7. The circuit of claim 6, wherein the first flip-flop, the second flip-flop, and the third flip-flop are all D flip-flops; the first decoder and the second decoder are 2-4 decoders; and the third decoder is a 1-2 decoder.

* * * * *